(12) United States Patent
Janssen (10) Patent No.: US 6,993,732 B2
(45) Date of Patent: Jan. 31, 2006

(54) DESIGN OF A POINTERLESS BDD PACKAGE

(75) Inventor: Gradus Janssen, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 223 days.

(21) Appl. No.: 10/054,036

(22) Filed: Jan. 22, 2002

(65) Prior Publication Data

US 2002/0174405 A1    Nov. 21, 2002

Related U.S. Application Data

(60) Provisional application No. 60/276,239, filed on Mar. 15, 2001.

(51) Int. Cl.
*G06F 17/50* (2006.01)
*G06F 9/45* (2006.01)

(52) U.S. Cl. .................................. 716/4; 716/1; 716/5
(58) Field of Classification Search .................... 716/1, 716/2, 3, 4, 5, 7, 18
See application file for complete search history.

(56) References Cited

PUBLICATIONS

Biere, "The ABCD package," Jun. 1998, one page, taken from http://www.inf.ethz.ch/~biere/projects/abcd/old-abcd-page.html.*
Biliris, "An Efficient Database Storage Structure for Large Dynamic Objects," 1992 Proceedings of 8$^{th}$ Int'l Conference on Data Engineering, pp. 301-308.*
Edelkamp, "StaticBdd a A fast BDD package," Dec. 1999, one page, taken from http://www.informatik.uni-freiburg.de/~edelkamp/StaticBdd/index.html.*
Ch. Meinel, et al., "www.bdd-portal.org", Proceedings of the IEEE IWLS '2000, Dana Point (California, USA), 2000, pp. 341-348.
David E. Long, "The Design of a Cache-Friendly BDD Library", Bell Laboratories, Lucent Technologies.
Richard Rudell, "Dynamic Variable Ordering for Ordered Binary Decision Diagrams", IEEE, Mountain View, California, 1993, pp. 42-47.
Randal E. Bryant, "Graph-Based Algorithms for Boolean Function Manipulation", IEEE Transactions on Computers, C-35-8, pp. 677-691, Aug., 1986.
Karl S. Brace, et al., "Efficient Implementation of a BDD Package", 27th ACM/IEEE Design Automation Conference, 1990, pp. 40-45.
Fabio Somenzi, "Efficient Manipulation of Decision Diagrams", Dept. of Electrical and Computer Engineering, Univ. of CO at Boulder, Boulder, CO, 2001, pp. 171-181.
Bwolen Yang, et al., "A Performance Study of BDD-Based Model Checking", Proceedings of 2nd Int'l Conf. on Formal Methods in Computer-Aided Design, Palo Alto, CA, 1998, pp. 255-289.
David Long, "Subject: RE: Breakpoint", private e-mail to G. Janssen, Oct. 1999.

* cited by examiner

*Primary Examiner*—Leigh M. Garbowski
(74) *Attorney, Agent, or Firm*—Ference & Associates (57) ABSTRACT

A pointerless BDD package. A strict ordering is enforced on the BDD node identifiers and the advantageous consequences of that decision, such as a better memory locality of the nodes and faster unique table lookup, are reaped. The performance of a pointer based package appears to be exceeded, and reproducible results are attained across different platforms.

15 Claims, 4 Drawing Sheets

CPU TIME FOR 48 DLX2 BENCHMARKS

FIG. 5

MEMORY USAGE FOR 48 DLX2 BENCHMARKS

FIG. 6
CPU TIME OF NEW VS. OLD TOOL FOR IBM MACROS

DESIGN OF A POINTERLESS BDD PACKAGE

CLAIM FOR PRIORITY

This application claims priority from U.S. Patent Application Ser. No. 60/276,239, filed on Mar. 15, 2001, and which is hereby incorporated by reference as if fully set forth herein.

FIELD OF THE INVENTION

The present invention relates generally to Binary Decision Diagram (BDD) packages.

BACKGROUND OF THE INVENTION

BDDs are effectively deployed in many EDA (Electronic Design Automation) tools, in particular in the area of formal verification. A plethora of public domain BDD packages is available on the web (see Meinel, Ch. Wagner, A., "WWW.BDD-PORTAL.ORG", Proc. IEEE IWLS [Institute of Electrical and Electronics Engineers; International Workshop on Logic and Synthesis], pp. 341–348, 2000; [http colon backslash backslach www dot bdd-portal dot org]).

David Long (in D. E. Long, "The Design of a Cache-Friendly BDD Library", Proc. ICCAD [International Conference on Computer Aided Design], pp. 639–645, 1998) introduces the notion of node-age and rearranges node allocation and garbage collection accordingly. Here, pointers are used to identify nodes. Problems are encountered when the memory allocator issues out-of-order blocks. The "reference objects" (analogous to what is termed further below as "handles") use a hash table to ensure uniqueness (D. E. Long, private (email) communication, 1999) It will be shown further below that, in accordance with at least one embodiment of the present invention, no intermediate data structure is necessary; a slightly different garbage collection algorithm is used.

Other disadvantages have been observed in connection wit prior efforts. Long 1998, supra, does not address dynamic variable ordering. The BDDs as implemented in earlier versions of SMV (Symbolic Model Verifier) (see K. L. McMillan, Symbolic Model Checking, Kluwer, 1993), do not use node reference counts; a mark-sweep garbage collector is used. For variable reordering an algorithm by R. Rudell (R. Rudell, "Dynamic variable ordering for ordered binary decision diagrams", Proc. ICCAD, pp. 42–47, 1993) is employed, but SMV does excessive BDD traversals to calculate accurate live node counts because no explicit reference counts are used. A package called ABCD (Biere, Armin, ABCD: a compact BDD library, http colon backslash backslash www dot inf dot erhz dot ch backslash personal backslash biere backslash projects backslash abed, 2000) focuses on compactness of representation (only 8 bytes per node) and uses indices to achieve this. It does not take advantage of the node order and does not offer dynamic variable ordering. Also its memory management is rather rigid.

In view of the foregoing, a need has been recognized in connection with overcoming the shortcomings and disadvantages presented by conventional arrangements.

SUMMARY OF THE INVENTION

Broadly contemplated in accordance with at least one presently preferred embodiment of the present invention is a pointerless BDD package. A strict ordering is enforced on the BDD node identifiers and the advantageous consequences of that decision, such as a better memory locality of the nodes and faster unique table lookup, are reaped. The performance of a pointer based package appears to be exceeded, and reproducible results are attained across different platforms.

In summary, the present invention provides, in one aspect, a binary decision diagram package comprising: an arrangement for identifying at least two nodes in a graph; the identifying arrangement being adapted to assign integer numbers to different nodes, whereby the use of pointers is precluded.

In another aspect, the present invention provides a method of employing a binary decision diagram package, the method comprising the steps of: identifying at least two nodes in a graph; the identifying step comprising assigning integer numbers to different nodes, whereby the use of pointers is precluded.

Furthermore, in an additional aspect, the present invention provides a program storage device readable by machine, tangibly embodying a program of instructions executable by the machine to perform method steps for employing a binary decision diagram package, the method comprising the steps of: identifying at least two nodes in a graph; the identifying step comprising assigning integer numbers to different nodes, whereby the use of pointers is precluded.

For a better understanding of the present invention, together with other and further features and advantages thereof, reference is made to the following description, taken in conjunction with the accompanying drawings, and the scope of the invention will be pointed out in the appended claims.

DESCRIPTION OF THE PREFERRED EMBODIMENTS

Herein it is assumed that the common terminology of BDDs is known (see R. E. Bryant, "Graph-Based Algorithms for Boolean Function Manipulation, IEEE Trans. on Computers", pp. 677–691, 1986): Boolean functions are canonically represented by a multi-rooted directed acyclic graph (DAG); nodes are kept in a unique table; operations are sped up by employing a computed table. Occasionally, the order of variables may be changed to reduce the total number of nodes. An additional basis for understanding and appreciating the embodiments of the present invention is the "classical" way of implementing a BDD package in an imperative programming language like C (see, e.g., K. S. Brace, R. L. Rudell, R. E. Bryant, "Efficient Implementation of a BDD Package", Proc. 27th DAC [Design Automation Conference], pp. 40–45, 1990): nodes are C structures that contain a variable identifier and THEN and ELSE children pointers; a NEXT pointer links nodes together that belong to the same collision chain in the unique table. Recycling of nodes is easily implemented by keeping a reference count for each node.

Herebelow, most of the classical implementation decisions are essentially discarded and a "fresh start" is made with a new set of requirements. The desirability of doing this relates to the fact that a pointer based BDD package almost invariably will use hashing on pointer values. This means that even on the same machine, a repeated invocation of the same program based on such a package need not exhibit the exact same behavior: nodes get allocated to different addresses, these pointers get hashed to different table indices, causing a different pattern of hits and misses in the computed table, and ultimately the usage of nodes and the sizes of the resultant BDDs might differ because of (presumably unpredictable) calls to garbage collections and dynamic variable orderings that are triggered by heuristics depending on node usage. On a different machine, the behavior might even get more erratic because of different memory alignment requirements, different direction of run-time stack growth, et cetera. All in all, it could be said that debugging such a BDD package is a programmer's nightmare.

A second important reason to deviate from a pointer based implementation is the opportunity to uniquely identify nodes by (consecutive) integer numbers and thereby achieve better control over node allocation. Being able to control the assignment of numbers to identify nodes, naturally imposes a strict order on the nodes. This order can be used to one's advantage: keep the DAG (Directed Acyclic Graph) ordered like a priority queue, hence searching for a particular node will obviously benefit; keep collision chains ordered, then on average less time is spent searching. Since BDDs are typically constructed bottom-up in a recursive depth-first fashion and since traversal of BDDs is a common operation that proceeds in a similar fashion, it pays off to keep adjacent (parent and children) nodes close in memory as well.

Lastly, the use of indices provides more flexibility in the number of bits one allocates for storage of an index value. One is no longer bound to comply with the size of a pointer value for a given architecture.

In accordance with a preferred embodiment of the present invention, pointers are eschewed. Preferably, one may identify a node by a number and, desirably, this number coincides with the index in the memory array where the node resides. Preferably, one may assume the availability of a single, contiguous array of nodes. Conceptually, this would appear to be an easy way to implement the node memory; in reality one may find that repeatedly having to re-allocate such a large contiguous array is not feasible. Unlike the proposal in Long '98, supra, a complicated scheme of memory blocks is eschewed herein in favor of a paging oriented solution. By this, it is meant that an index is split in a page index part and a page offset part. A two-step access scheme will get the page by indexing in a page table and get the element in that page via the offset. Consequently, when the need for more nodes arises, extra pages are allocated. It is also possible to de-allocate a page after garbage collection has found that all nodes in that page are dead.

Preferably, any reference to a BDD node will be done by means of its index; the THEN, ELSE, and NEXT fields of a node may also therefore be considered indices.

Figure 1:
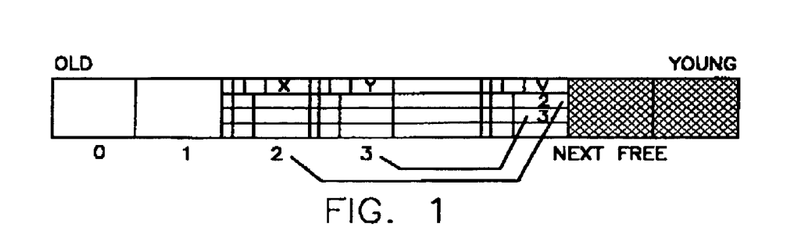
FIG. 1 schematically illustrates the linearly organized node memory and the concept of node age, wherein old nodes have small numbered indices and young nodes are at higher numbered indices.

Preferably, nodes are handed out in order of increasing indices, so that the newest (or youngest) node has the largest index. One may think of the index of a node as its date of birth, such that a young node has a "recent" date of birth. In the BDD DAG, where one will naturally allocate the parent node later than the children nodes, there will be the counterintuitive situation that a parent node is younger than its two children (FIG. 1).

Complemented edges are handled in a way that is similar to what has been used in pointer-based packages. Complemented edges are defined by merely flipping the most significant bit of the 32-bit unsigned integer index value of a node.

Complemented edges are of course not a necessity, but, as Fabio Somenzi points out (see F. Somenzi, "Efficient Manipulation of Decision Diagrams, Software Tools for Technology Transfer", International Journal on Software Technology Transfer, Volume 3, Issue 2, Pages 171–181, Spinger-Verlag, 2001), they do offer more advantages than just a simple way of representing the negated function and a trivial implementation for the logical not operation. Indeed, because one is able to do complementation and test for complement both in constant time, one may define more bottom cases to speed-up other operations as well, e.g. the and operation can now test for complemented operands and immediately return the 0 (zero/false) BDD. Rules of DeMorgan (i.e., rules that stipulate how to express a logical conjunction as a negated logical disjunction and vice versa, e.g. The phrase "I like apples and I like pears" is equivalent with "It is not the case that I don't like apples or that I don't like pears") can be used at negligible cost to reduce the number of distinct cases that need be implemented and at the same time make entries in the computed table more uniform. Also, some applications rely on the fact that the root nodes of a pair of complemented BDDs are in fact the same and, in this way, share certain attributes.

The next departure from the classical approach is to refrain from using reference counts. They would not be of much use anyway because dead nodes, i.e., nodes with a 0 reference count, cannot be (directly) reused when node indices are required to obey the age requirement. The consequences can be rather severe, in that one would no longer have a precise notion of whether a node is alive or dead. It will be harder to find useful metrics to be used in heuristics that control invocation of garbage collection and dynamic variable ordering calls. When implementing dynamic variable ordering based on local level swaps, it is crucial to have a precise measure for the number of nodes gained by that swap. This will be elucidated in more detail further below.

Not using reference counts saves space in the node (typically 16 bits are used for a reference count) and saves time: directly, because no increments and decrements need be performed; and indirectly, because the referred node itself need not be accessed and therefore one has fewer "moves" across the memory hierarchy. Actually, in some model-checking benchmarks (see Bwolen Yang, et al., "A Study of BDD Performance in Model Checking, Formal Methods in Computer Aided Design", pp. 255–289) it was observed that quite often one and the same BDD is repeatedly constructed and immediately disposed of. This was the reason of the invention of a so-called death row data structure. Its purpose is to queue BDDs that are candidates to be freed. The actual freeing is postponed in the hope that they might get resurrected and put to use again before the queue is full and the real freeing kicks in. Without reference counts, there is no longer a need to worry about this behavior.

Figure 2:
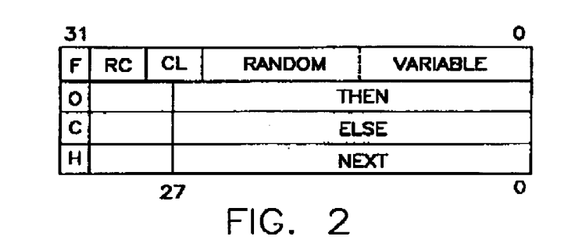
FIG. 2 schematically illustrates the memory layout of a BDD node.

FIG. 2 outlines the various fields in a BDD node in accordance with an embodiment of the present invention, wherein: F (flag) is a general purpose mark bit, mainly used during garbage collection to distinguish live nodes from dead ones; RC is a 2-bit reference counter; Cl (class) indicates the size of the Variable field (either 8, 12, 16, or 24 bits); left over bits will hold a Random bit pattern; C is the complement bit of the Else index and H is the handle flag. ("0" indicates that the complement bit of the THEN index is always zero [off].) The role of these fields will be clarified further below.

In order for garbage collection to be meaningful, one will preferably have a means of gathering all BDD nodes currently referenced by an application. These external references are the starting points of a node marking scheme that identifies all live nodes. Such external references are captured by handle objects. A handle implements the external view of a BDD. For simplicity, handles will have reference counts and therefore can easily be recycled. It is expected that the number of live handles at any time will be much less than the current number of live BDD nodes. Handles are to be interpreted as the Boolean functions of interest, and each function typically comprises many BDD nodes. Obviously, a handle should be unique with respect to the node it refers to. Handles are a very favorable place in which to cache additional data about the Boolean function, e.g. its size and its set of support variables.

With several "ground rules" established, the disclosure now turns to various related consequences and, particularly, the impact of various new requirements on the rest of a framework in accordance with at least one embodiment of the present invention.

Strong canonicity is achieved by ensuring that the triple <v,T,E> is associated with a unique node. The triple <v,T,E> includes the variable identifier v and the edges to the THEN and NEXT sub-BDDs which themselves are assumed to be made up of unique nodes. In the present example, T and E are the (possibly complemented) indices of the children nodes. A simple and fast implementation applies a hash function to the triple to obtain the index in the unique table of the start of a collision chain of nodes. Comparing the triple against the nodes in the chain resolves the look up. Note that instead of hashing on the children indices, one could choose to form a hash key of v and the signatures of the children nodes. One may define the signature sig(n) of a node n to be the value obtained from the concatenation of the fields Cl, Random, and Variable (see FIG. 2). The new hash key then is <v,sig(T),sig(E)>. Of course, in general the signature of a node is not unique, and one must therefore still search for matching children indices in the collision chain. The reason why we would want to use signatures is to make the hash key independent of the memory position (=index) of the node; when garbage collection moves the node in memory, at least its signature would stay the same. However, since the unique table is emptied and rebuilt during garbage collection, there is no real need to assure hash key independence. This does not hold for the computed table though, as will be seen shortly.

The computed table, a.k.a. operation cache, records results of operations on BDDs. Typically it stores the fact that R=op(F, G, H), i.e., the BDD R is the result of the operation op applied to three BDD arguments F, G, and H, in a hash table. The hash key should preferably be composed of the operation and its operands. But a question arises as to whether one should use the indices of the operand BDDs. If one did, and garbage collection alters indices, then one would need to rehash those entries in the computed table. If the hash key were independent of the indices, then one would merely need to invalidate entries that refer to dead nodes. As in the case of Long '98, supra, it is contemplated here that one define a signature for each node which is made up of the variable associated with that node (the Variable field) and a pseudo random number (whose sequence is of course deterministic; the Random field). Computed table hashing takes the signature of the operands and their complement bit as a key. Note that incorporating the complement bit is vital: it is easy to construct a case involving the calculation of the and of two parity functions which exhibits exponential behavior if the complement bit is left out.

Proper utilization of the computed table is important for efficiency. One should preferably avoid storing facts that are either trivial (typically these concern operations where some of the operands are constant) or facts that are very unlikely to ever be retrieved. The negative effect of storing too much is that crucial facts might get overwritten. Facts concerning operands with a low reference count (particularly, a single reference count) should be ignored. Unfortunately, in the present example there is no longer a reference count per node. Instead, one may preferably reintroduce a 2-bit saturating reference count (the RC field in the BDD node structure of FIG. 2) with the sole purpose of indicating whether a node has no, a single, or more references. It is not necessary to keep this count accurate (it is not even essential to decrement the count when nodes are freed). After every dynamic variable reordering, it should preferably be assured that the 2-bit reference count reflects the correct number of references as far as its resolution allows.

Most BDD packages use a reference counting garbage collector. The idea is simple: if one keeps count of the number of references to each BDD node, then a count of 0 means that the node is no longer in use and thus can be recycled. Often the recycling does not occur immediately. The dead node would have to be unlinked from the unique table and the entries in the computed table referring to this node would have to be invalidated; both of these steps are generally considered to be prohibitively costly. Instead, occasionally, when a certain percentage of the nodes is dead, the unique table is swept and all dead nodes are moved to a free list. The disadvantage of reference counting is the extra memory needed for each node and the overhead in increment and decrement operations. The great advantage is that at any time one has accurate knowledge of the number of references to each node.

In a mark-sweep garbage collector, a marking phase that identifies all live nodes is proceeded by a sweeping phase that cleans up the garbage (=dead) nodes. A prerequisite for this to work is that one know all external references to the nodes. Also, if one considers garbage collection as if it were an asynchronous process (which it would be if it were decided to run it as a separate thread), every intermediate BDD that occurs during a (recursive) operation needs to be explicitly protected. In a design in accordance with at least one embodiment of the present invention, there are actually two reasons why certain local variables in the program code need to be protected.

One reason is that if one does not protect a variable that holds an index to a BDD node that will be needed later, that node might be considered to be garbage by the collector.

The other reason, perhaps less immediately apparent, is that the garbage collector compacts the node memory and hence nodes get moved and their indices change. Preferably, a mechanism should be available that is able to report back the "change of address" of a node.

For this purpose, one may preferably use a mark-sweep-update-sweep approach. Here, the marking phase does what might be expected; in the first sweep over the node memory, from lower indices to higher indices, live nodes are assigned a forwarding address at their original position and are then moved over to the left to fill the holes created by the dead nodes. At the same time, the THEN and ELSE fields are updated to reflect the new positions of the children nodes. Note that the direction of the "pointers" THEN, ELSE, and NEXT in the node memory is always from right to left (because of the node-age rule). During the update phase, all external references and all explicitly protected internal references are notified of any change of address. Then the second sweep phase cleans the marks and reestablishes the unique table. See Algorithm 1 for more details. (It should be noted that Algorithms 1 and 2, as presented herein, are not written in "pure" C syntax; for the purposes of clarity the algorithms are instead written in "pseudo-code", not following any precise syntactic rules, but in a manner believed to be sufficiently clear as to impart the intent of each algorithm. It will be appreciated that conveying either algorithm herein in "pure" C syntax would involve a great deal of space and superfluous detail.) The process of compaction has the desirable property that it preserves node-age, moreover it even improves node proximity. In this connection, see FIG. 3. There is no apparent need to always consider all nodes for garbage collection; a user is allowed to set a breakpoint below which nodes will be frozen. This might be beneficial in those applications that keep some initial BDDs around for most of their life-time, e.g. in model checking one could set the breakpoint after the next-state function BDDs.

---
Algorithm 1
---

Figure 3:
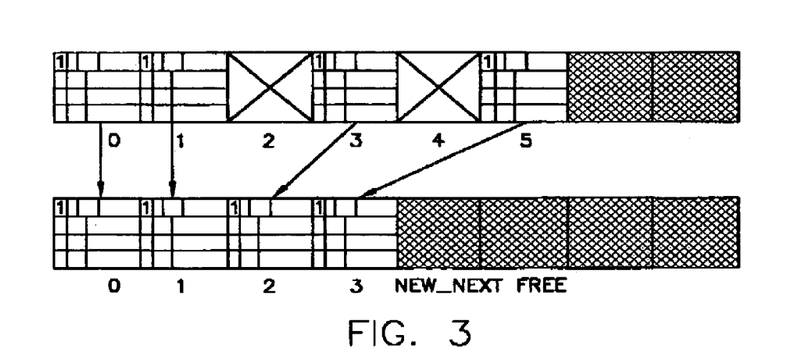
FIG. 3 schematically illustrates the compaction of node memory during garbage collection.

```
void gc(void)
{
    mark_phase ( ); /* marks all live nodes */
    /* Compact the live nodes: */
    new_nextfree = 0;
    for (i = 0; i < nextfree; i++)
        if (marked(i)) {
            n = new_nextfree++;
            THEN(i) = FORWARD(THEN(i));
            ELSE(i) = FORWARD(ELSE(i));
            /* Copy node i to n but retain n's mark flag and
                    forwarding address: */
            mark_n = MARK(n);
            forward_n = FORWARD(n);
            mem[n] = mem[i];
            MARK(n) = mark_n;
            FORWARD(n) = forward_n;
            /* Leave forwarding address at i: */
            FORWARD(i) = n;
        }
    invalidate_computed_table ( );
    update_phase ( ); /* notifies handles */
    /* Clear marks and reestablish unique table: */
    for (i = 0; i < new_nextfree; i++) {
        unmark(i);
        add node i to unique table;
    }
}
```
---

Dynamic variable ordering is the process of changing the rank order of the variables in the presence of BDDs. This implies that all existing BDDs need to be modified to reflect the new variable positions. The objective is to decrease the overall size of the BDDs. Like garbage collection, dynamic variable ordering should best be considered an asynchronous process that potentially can be invoked at any time during the construction and manipulation of BDDs. An explanation will now be provided as to how the Rudell sifting algorithm (see Rudell, supra) can be implemented in accordance with at least one embodiment of the present invention. The basic operation of swapping two neighboring variables is focused upon. Clearly, exchanging parent and children nodes destroys the node-age property. Moreover, one will need an accurate measure of the number of nodes gained (or lost) by a swap. The following solutions are thus contemplated in accordance with at least one embodiment of the present invention.

First, one need not rely on node-age during dynamic variable ordering; the BDDs can be carefully rebuilt afterwards to reestablish this invariant. This also means that the unique table may not assume a certain order of the nodes in its collision chains.

All nodes are then preferably taken out of the original unique table and stored in linked lists per variable (using the NEXT field). The lists are stored in a table indexed by rank numbers.

Full-fledged reference counts are then preferably reintroduced for the nodes. The reference count can conveniently be stored in the space for the variable identifier. In the present approach, three phases are distinguished: 1) the prologue that prepares the rank table of node lists and sets appropriate reference counts, 2) the processing phase that does the actual level swaps, and 3) the epilogue that reestablishes the node-age invariant and unique table. The processing phase is not much different from an implementation that uses separate unique tables per variable, except that it operates on the rank table.

Algorithm 2 outlines the processing of the lists of two neighboring rank levels to establish a variable swap. Note that during a level swap the unique table only stores nodes labeled with the same variable. One need not explicitly hash on the variable and need not store it.

---
Algorithm 2
---

```
void swap_levels(k, k+1)
{
    for (n in level[k+1])
        mark(n);
    for (n in level[k])
        if (!marked(THEN(n)) && !marked(ELSE(n)))
            move n to unique table;
    for (n in level[k]) {
        T = THEN(n); E = ELSE(n);
        n11 = marked(T)? THEN(T): T;
        n10 = marked(T)? ELSE(T): T;
        n01 = marked(E)? THEN(E): E;
        n00 = marked(E)? ELSE(E): E;
        THEN(n) = ut_lookup(vk, n11, n01);
        ELSE(n) = ut_lookup(vk, n10, n00);
    }
    for (n in level[k+1]) {
        unmark(n); remove n from level[k+1];
        if (dead(n))
            put n on freelist;
        else
            add n to level[k];
    }
    for (n in unique table)
        remove from unique table;
        add to level[k+1];
    }
    swap(rank(vk), rank(vk+1));
}
```

Preferably, in accordance with at least one embodiment of the present invention, all major data structures are defined relative to a manager record. In this way, multiple invocations of the BDD package can coexist. Since handles are also not pointers but indices into some table that is owned by a manager, the problem is encountered of associating a manager with each handle. A solution is to encode a manager index into the object that holds the handle index. In the present example a 3-bit index is contemplated, allowing for 8 managers. Should the need arise to enlarge the number of managers one could always resort to 64-bit handle objects.

Figure 4:
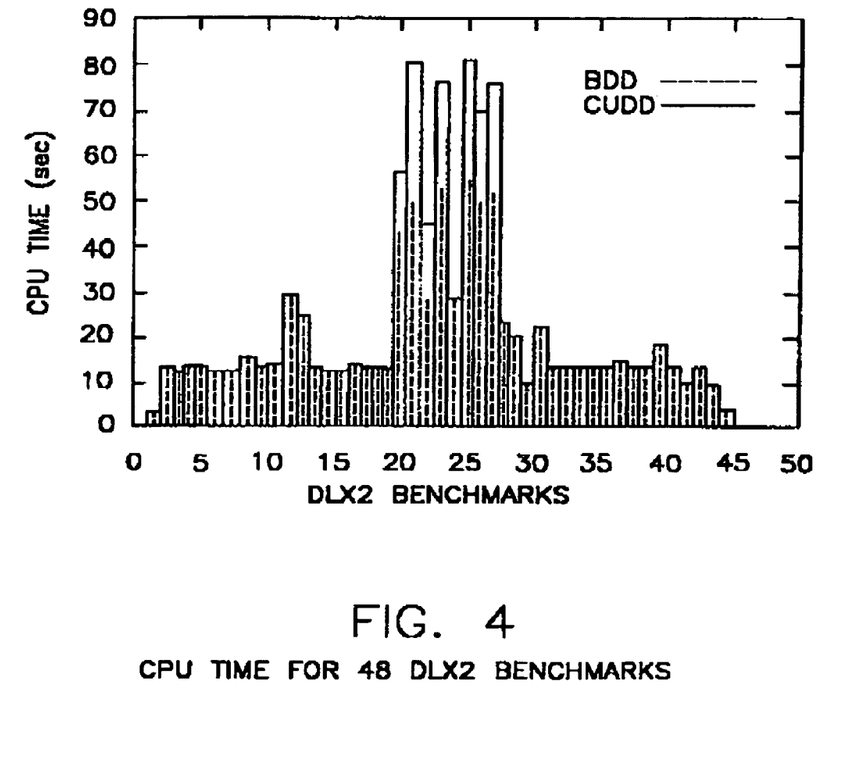
FIG. 4 is a graph of experimental results showing CPU time spent on 48 DLX2 benchmarks using a proposed BDD package vs. CUDD.

Two sets of experiments are presented here. They were run on an IBM 200 MHz Power3 machine. First it is shown how a BDD package in accordance with the present invention compares to CUDD 2.3.0 (see F. Somenzi, "CUDD: CU Decision Diagram Package Release", ftp colon backslash backslash vlsi dot colorado dot edu backslash, 1998). Next the results are shown for some industrial designs comparing the new package to the existing pointer-based package (by the same author). In FIG. 4, the CPU time in seconds for CUDD (bars) and BDD (spikes) is plotted for the 48 DLX2 benchmarks, prepared by Velev, Miroslav N., "Superscalar Suite 1.0", http colon backslash backslash www dot ece dot cmu dot edu backslash tilda mveley, 1999, in trace form (see Yang, supra).

Figure 5:
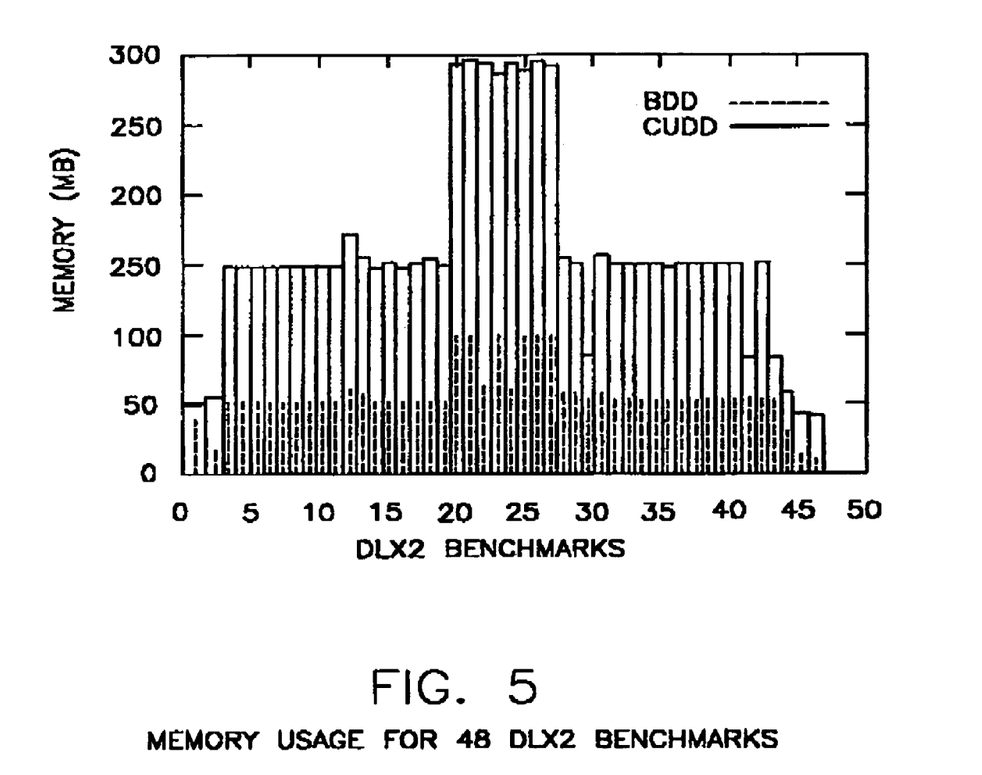
FIG. 5 is a graph of experimental results showing memory usage of a BDD package vs. CUDD on the 48 DLX2 benchmarks.

Note that BDD tracks CUDD very closely for the small problems up to 30 CPU secs, but is much faster for the larger problems and in general uses much less memory, as can be seen from FIG. 5. Care was taken to set the parameters of BDD to mimic CUDD settings. Still, the two-times speedup reported in Long '98, supra, was not generally observed.

Figure 6:
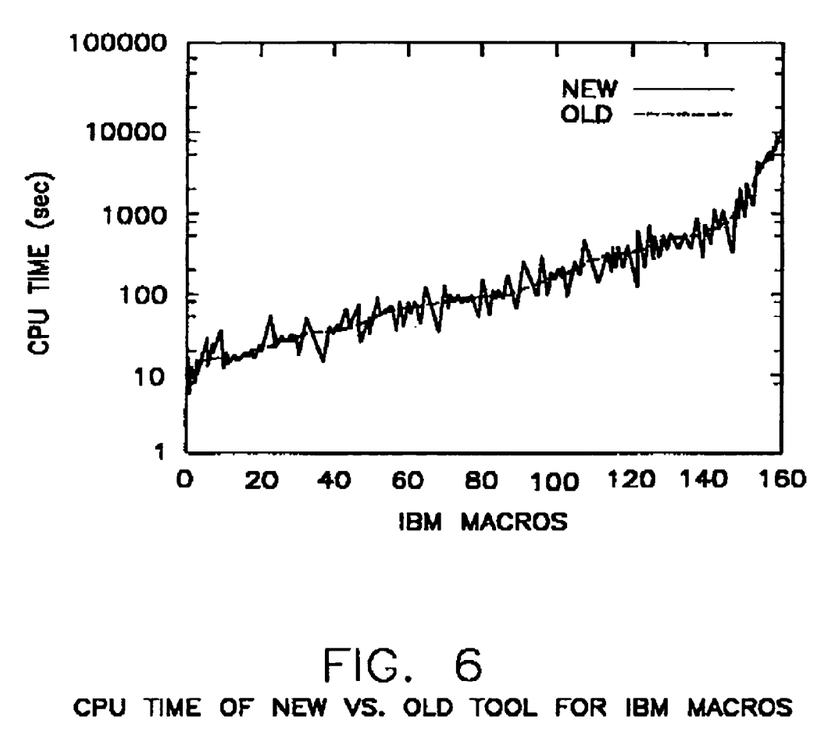
FIG. 6 is a graph of experimental results showing two Verity™ runs on a set of macros.

FIG. 6 shows the result of two Verity™ runs on a set of macros. The macros on the X-axis are ordered according their non-decreasing runtime when using the old package; the squiggly line connects the points for the new package. Note that to the right (toward larger runtimes) the new package mostly lies under the old line. Because of the logarithmic scale, the gain in CPU time doesn't appear as pronounced as it actually is.

In recapitulation, a radically different approach to the implementation of a BDD package is proposed. The approach combines several ideas into a consistent and efficient framework: use of indices instead of pointers throughout the major data structures, compact nodes, separate handle objects, strict node ordering and mark-sweep garbage collection. Experience with the new BDD package so far confirms initial expectations that it favorably compares with the best packages available. It has been shown herein how to incorporate the core operation of any dynamic variable reordering variant. Additional experimentation could potentially afford more insight into the various tuning heuristics that are employed.

In further recapitulation, broadly contemplated in accordance with at least one presently preferred embodiment of the present invention is a new design for a BDD package in a programming language such as C that uses indices (non-negative integers) to identify the nodes. This fact in itself would appear to be a deviation from Long '98, supra; there, there appears to be an insistence on using pointers while node ordering is defined as being based on the addresses of the memory where the nodes reside. Using indices, one may obtain better control over node allocation and can easily achieve platform independence.

It is to be understood that the present invention, in accordance with at least one presently preferred embodiment, includes an arrangement for identifying at least two nodes in a graph, which may be implemented on at least one general-purpose computer running suitable software programs. It may also be implemented on at least one Integrated Circuit or part of at least one Integrated Circuit. Thus, it is to be understood that the invention may be implemented in hardware, software, or a combination of both.

If not otherwise stated herein, it is to be assumed that all patents, patent applications, patent publications and other publications (including web-based publications) mentioned and cited herein are hereby fully incorporated by reference herein as if set forth in their entirety herein.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A binary decision diagram package comprising:
an arrangement for identifying at least two nodes in a graph;
said identifying arrangement configured to assign integer numbers to different nodes, resulting in precluding the use of pointers and maintaining at least a partial order among the nodes.

2. The package according to claim 1, wherein said identifying arrangement is configured to assign consecutive integer numbers to different nodes.

3. The package according to claim 1, wherein said identifying arrangement is configured to assign to a given node an integer number which coincides with an index in a memory array in which the node resides.

4. The package according to claim 1, wherein said identifying arrangement is configured to access an indexed node via a paging access scheme.

5. The package according to claim 4, wherein said identifying arrangement is configured to access an indexed node via a two-step paging access scheme.

6. The package according to claim 1, wherein said identifying arrangement is configured to avoid the use of reference counts.

7. The package according to claim 1, wherein the graph is a directed acyclic graph.

8. A method of employing a binary decision diagram package, said method comprising the steps of:
identifying at least two nodes in a graph;
said identifying step comprising assigning integer numbers to different nodes, resulting in precluding the use of pointers and maintaining at least a partial order among the nodes.

9. The method according to claim 8, wherein said assigning step comprises assigning consecutive integer numbers to different nodes.

10. The method according to claim 8, wherein said assigning step comprises assigning to a given node an integer number which coincides with an index in a memory array in which the node resides.

11. The method according to claim 8, wherein said identifying step comprises accessing an indexed node via a paging access scheme.

12. The method according to claim 11, wherein said accessing step comprises accessing an indexed node via a two-step paging access scheme.

13. The method according to claim 8, wherein said identifying step includes avoiding the use of reference counts.

14. The method according to claim 8, wherein the graph is a directed acyclic graph.

15. A program storage device readable by machine, tangibly embodying a program of instructions executable by the machine to perform method steps for employing a binary decision diagram package, said method comprising the steps of:

identifying at least two nodes in a graph;

said identifying step comprising assigning integer numbers to different nodes, resulting in precluding the use of pointers and maintaining at least a partial order among the nodes.

* * * * *